(12) United States Patent
Sakuma

(10) Patent No.: US 9,379,302 B2
(45) Date of Patent: Jun. 28, 2016

(54) METHOD OF MANUFACTURING THE THERMAL FLUID FLOW SENSOR

(71) Applicant: HITACHI AUTOMOTIVE SYSTEMS, LTD., Hitachinaka-shi, Ibaraki (JP)

(72) Inventor: Noriyuki Sakuma, Kodaira (JP)

(73) Assignee: Hitachi Automotive Systems, Ltd., Hitachinaka-shi, Ibaraki (JP)

(*) Notice: Subject to any disclaimer, the term of this patent is extended or adjusted under 35 U.S.C. 154(b) by 267 days.

(21) Appl. No.: 14/253,938

(22) Filed: Apr. 16, 2014

(65) Prior Publication Data

US 2014/0227819 A1    Aug. 14, 2014

Related U.S. Application Data

(62) Division of application No. 13/351,157, filed on Jan. 16, 2012, now Pat. No. 8,714,008.

(30) Foreign Application Priority Data

Mar. 25, 2011  (JP) ................. 2011-066964

(51) Int. Cl.
  *H05B 3/00*     (2006.01)
  *H01L 35/34*    (2006.01)
  *G01F 1/684*    (2006.01)
  *G01F 1/692*    (2006.01)

(52) U.S. Cl.
  CPC ............. *H01L 35/34* (2013.01); *G01F 1/6845* (2013.01); *G01F 1/692* (2013.01); *Y10T 29/49082* (2015.01); *Y10T 29/49124* (2015.01)

(58) Field of Classification Search
  CPC .............. G01F 1/688; G01F 1/6847; A61B 2562/0271; G01P 5/10; Y10T 29/49002; Y10T 29/49082; Y10T 29/49124; Y10T 29/49099
  USPC ........................ 29/611, 610.1, 825, 829, 846; 73/204.23, 204.25, 204.26
  See application file for complete search history.

(56) References Cited

U.S. PATENT DOCUMENTS

| 4,688,424 A | 8/1987 | Handtmann et al. |
| 4,735,086 A | 4/1988 | Follmer |

(Continued)

FOREIGN PATENT DOCUMENTS

| JP | 60-142268 A | 7/1985 |
| JP | 2008-157742 A | 7/2008 |

(Continued)

*Primary Examiner* — Thiem Phan
(74) *Attorney, Agent, or Firm* — Miles & Stockbridge P.C.

(57) ABSTRACT

In a thermal sensor with a detection part and a circuit part formed on the same substrate, an insulating film for protection of the circuit part causes problems of lowering in sensitivity of a heater, deterioration in accuracy due to variation of a residual stress in the detection part, etc. A layered film including insulating films is formed on a heating resistor, an intermediate layer is formed thereon, and a layered film including insulating films is formed further thereon. The intermediate layer is specified to be a layer made up of any one of aluminum nitride, aluminum oxide, silicon carbide, titanium nitride, tungsten nitride, and titanium tungsten. This configuration enables the layered film on the upper part of the detection part to be removed using the intermediate layer as an etch stop layer, which solves problems of lowering in sensitivity, a variation in residual stress, etc. resulting from these.

5 Claims, 9 Drawing Sheets

(56) References Cited

U.S. PATENT DOCUMENTS

| | | | |
|---|---|---|---|
| 5,231,878 A | 8/1993 | Zanini-Fisher et al. | |
| 5,763,775 A | 6/1998 | Sato et al. | |
| 7,228,614 B2 | 6/2007 | Yamada et al. | |
| 7,673,508 B2 * | 3/2010 | Sakuma | G01F 1/6845 73/204.26 |
| 7,765,679 B2 * | 8/2010 | Yao | G01F 1/6845 216/16 |
| 8,429,964 B2 | 4/2013 | Sakuma | |
| 2008/0148842 A1 | 6/2008 | Oda | |
| 2009/0188314 A1 | 7/2009 | Sakuma | |
| 2010/0139391 A1 | 6/2010 | Sakuma | |

FOREIGN PATENT DOCUMENTS

| | | |
|---|---|---|
| JP | 2009-180504 A | 8/2009 |
| JP | 2010-133897 A | 6/2010 |
| JP | 2010-281758 A | 12/2010 |

* cited by examiner

METHOD OF MANUFACTURING THE THERMAL FLUID FLOW SENSOR

CROSS REFERENCE TO RELATED DOCUMENTS

This application is a Division of U.S. application Ser. No. 13/351,157, filed on Jan. 16, 2012, now U.S. Pat. No. 8,714,008, which claims priority to Japanese Application Nos. 2011-066964, filed on Mar. 25, 2011.

CLAIM OF PRIORITY

The present application claims priority from Japanese patent application JP 2011-066964 filed on Mar. 25, 2011, the content of which is hereby incorporated by reference into this application.

FIELD OF THE INVENTION

The present invention relates to a thermal sensor and a method of manufacturing the thermal sensor, and more specifically, to a thermal sensor using a heating resistor and a method of manufacturing the thermal sensor.

BACKGROUND OF THE INVENTION

At present, as fluid flow sensors that are installed in electronic control fuel injection apparatuses of internal combustion engines of vehicles, etc. and are used for air flow meters for measuring intake air quantity, the thermal type sensor has become mainstream because of its capability of directly detecting mass air quantity.

Among these sensors, especially a thermal air flow sensor manufactured by a semiconductor micromachining technology has attracted attentions because it can reduce a cost and is drivable with a low electric power. There are the following documents as conventional technologies of air flow sensors like this. For example, Japanese Unexamined Patent Application Publication No. S60 (1985)-142268 discloses an air flow sensor in which the heating resistor and a temperature measuring resistor (sensor) for measuring air flow rate are placed on a cavity formed by anisotropically etching a part of a Si substrate. Here, in Japanese Unexamined Patent Application Publication No. S60(1985)-142268, circuits of heater heating control, compensation of the flow rate output, and the like are produced on a different substrate. Therefore, the air flow rate detecting substrate and the circuit substrate need to be wire-connected by wire bonding, which gives problems of an increased cost caused by an increase in the number of parts, an increase in the number of processes by additional inspection after each assembly, lowering in a yield by assembly failure, etc.

There is Japanese Unexamined Patent Application Publication No. 2008-157742 as a technology for addressing these problems. This document discloses a thermal air flow meter in which a circuit part including MOS transistors and diode elements and a flow rate detection part having a diaphragm made by removing the Si substrate are formed on the same substrate. Therefore, a hard wiring process, such as the above-mentioned wire bonding, becomes unnecessary, and components can be reduced in count.

SUMMARY OF THE INVENTION

However, in Japanese Unexamined Patent Application Publication No. 2008-157742, since the insulating film configurations of the circuit part and a flow rate detection part are set identical and the protective film by a thick inorganic insulating film that is the uppermost layer of the circuit part is also formed in the air flow rate detection part, there is a problem that a heat quantity of a heater is deprived by the protective film and its sensitivity falls.

Moreover, in Japanese Unexamined Patent Application Publication No. 2008-157742, there is a problem that since the protective film that is a circuit part uppermost layer is located even over the upper layer of the flow rate detection part, when a heater of the flow rate detection part is heated, a residual stress of the protective film varies, and resistance values of the heater and a sensor vary from their initial values, which deteriorates measurement accuracy. Since the protective film is on the wiring layer for connecting a MOS transistor, the heater, and the sensor, the inorganic insulating film formed at a low temperature of 400° C. or less is usually used. Since the inorganic insulating film formed at a low temperature like this has a large stress variation by heat, the above-mentioned problem that the residual stress varies becomes notable specially.

Based on the above points, an object of the present invention is to form the detection part having a heating resistor and a control circuit for controlling the heating resistor on the same substrate and to provide a high-sensitivity and high-precision thermal sensor.

According to one aspect of the present invention, there is provided a thermal sensor that has: a semiconductor substrate; a first layered film that is provided above the semiconductor substrate and includes multiple insulating films; the detection part that is provided on the first layered film layer and has the heating resistor; the circuit part that is provided on the semiconductor substrate and controls the heating resistor; a second layered film that is provided on the heating resistor and above the control circuit, and includes multiple insulating films; an intermediate layer provided on the second layered film; and a third layered film that is provided on the intermediate layer and above the control circuit, and includes multiple insulating films; wherein the intermediate layer is made up of any one of aluminum nitride, aluminum oxide, silicon carbide, titanium nitride, tungsten nitride, and titanium tungsten.

According to another aspect of the present invention, there is provided a thermal sensor that has: the semiconductor substrate; the first layered film that is provided above the semiconductor substrate and includes multiple insulating films; the detection part that is provided on the first layered film and has the heating resistor; the circuit part that is provided on the semiconductor substrate and controls the heating resistor; the second layered film that is provided on the heating resistor and above the control circuit, and includes multiple insulating films; the intermediate layer provided on the second layered film; and the third layered film that is provided in a region on the intermediate layer from which a portion above the detection part is excluded.

According to still another aspect of the present invention, there is provided a method of manufacturing the thermal sensor that is equipped with the detection part having the heating resistor and the circuit part having the control circuit for controlling the heating resistor, including: (a) forming the first layered film including multiple insulating films above the semiconductor substrate; (b) forming the heating resistor on the first layered film; (c) forming the control circuit on the semiconductor substrate; (d) forming the second layered film including multiple insulating films on the heating resistor and above the control circuit; (e) forming the intermediate layer on the second layered film; (f) forming the third layered film including multiple insulating films on the intermediate layer; and (g) etching a portion in the third layered film located above the detection part using the intermediate layer as an etch stop layer.

According to the aspects of the present invention, there can be provided a highly sensitive and highly reliable thermal sensor.

DETAILED DESCRIPTION OF THE PREFERRED EMBODIMENTS

Hereafter, embodiments of the present invention will be described, referring to drawings. Note that in the following embodiments, although explanations are given using thermal fluid flow sensors especially as examples of a thermal sensor, the invention of the application can be similarly applied to other sensors each using a heating resistor in a detection part, for example, a humidity sensor etc.

Moreover, in the following embodiments, a term "above" indicates a direction into which the detection part and a circuit part are formed (a direction into which insulating films etc. are layered) of directions perpendicular to the surface of a semiconductor substrate.

First Embodiment

Figure 1:
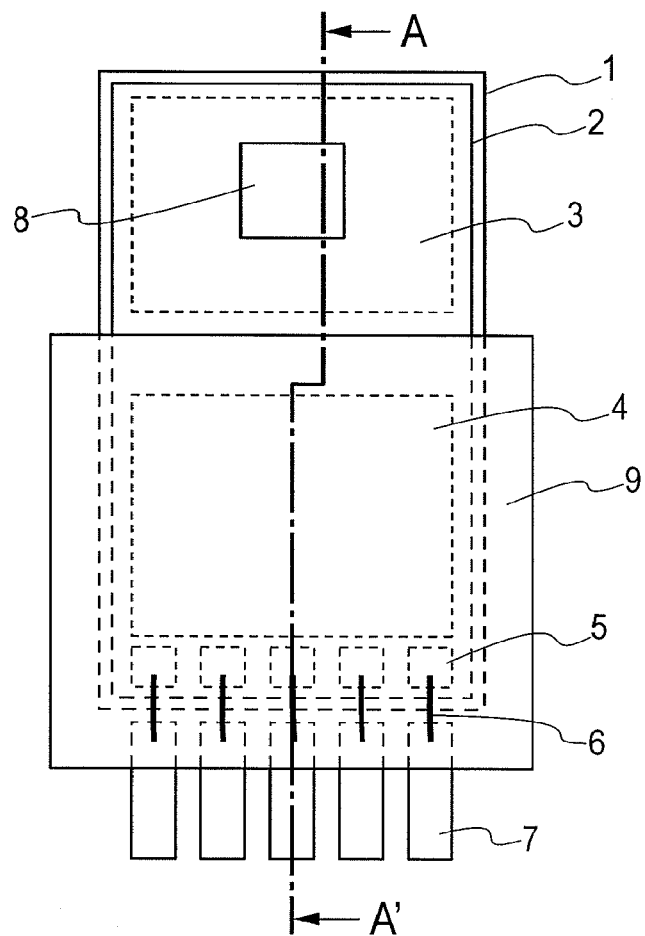
FIG. 1 is a main part plan view showing one example of a thermal fluid flow sensor according to a first embodiment of the present invention.
Figure 2:
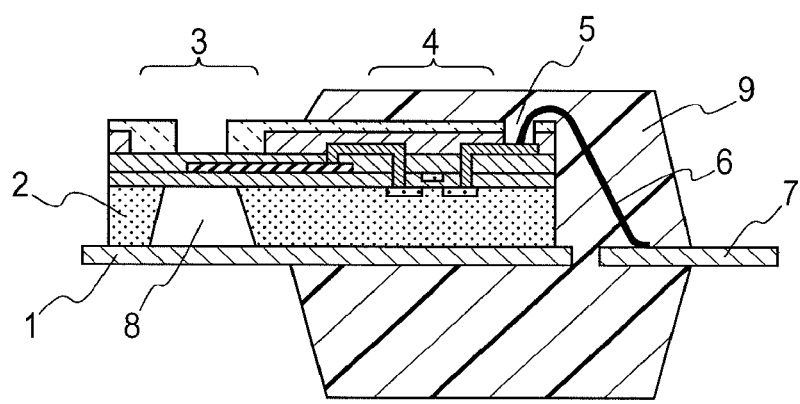
FIG. 2 is a main part sectional view of the thermal fluid flow sensor according to the first embodiment of the present invention.

FIG. 1 shows one example of a main part plan view of a thermal fluid flow sensor according to a first embodiment; FIG. 2 shows a main part sectional view taken along line A-A of FIG. 1.

As shown in FIG. 1 and FIG. 2, on a semiconductor substrate 2 mounted on a lead frame 1, the following are formed: an air flow rate measurement part 3 for detecting a flow rate of a fluid; a circuit part 4 for controlling heater heating on which MOS transistors, diodes, memory, etc. are formed; and electrodes 5 for input/output to/from the outside. A diaphragm structure 8 whose backside Si was removed is provided in the air flow rate measurement part 3. Moreover, the electrodes 5 and external terminals 7 of the lead frame are connected together through wire bonding 6, respectively. The circuit part 4 is supplied power source from the outside through these electrodes 5 and the external terminals 7 and outputs an air flow rate to the outside. Incidentally, a part in the semiconductor substrate 2 other than the air flow rate measurement part 3 is covered with a resin mold 9.

Next, one example of the method of manufacturing the thermal sensor in the first embodiment will be explained in a process order using FIG. 3 to FIG. 13. FIGS. 3 to 13 are main part sectional views showing in detail the semiconductor substrate 2 in FIG. 2.

Figure 3:
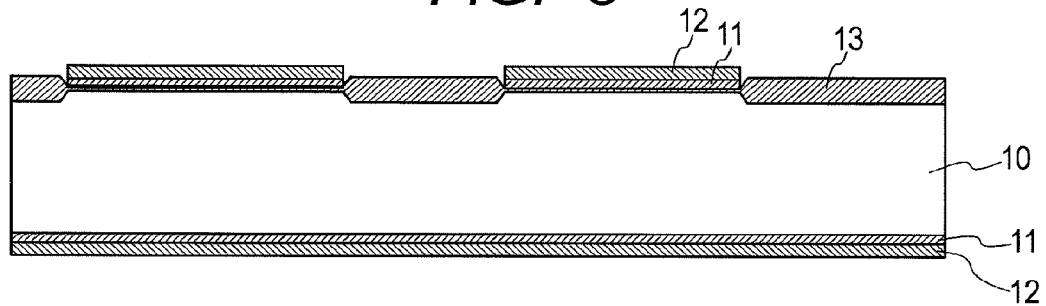
FIG. 3 is a main part sectional view showing a semiconductor substrate manufacturing process of the thermal fluid flow sensor according to the first embodiment of the present invention.

First, as shown in FIG. 3, a semiconductor substrate 10 made up of single crystal Si is prepared. Following this, a silicon oxide film 11 is formed on the semiconductor substrate 10 with a furnace body, a silicon nitride film 12 is formed using a CVD method, subsequently, patterning is performed using a photolithography method, and a thick silicon oxide film 13 for element isolation is formed by a process of thermally oxidizing a portion where the insulating film 11 and the insulating film 12 were removed at a high temperature. The silicon oxide film 13 at this time has a thickness of about 300 to 600 nm. Next, the insulating film 11 and the insulating film 12 are removed, a silicon oxide film 14 are again formed on a Si substrate surface to a thickness of 150 to 200 nm in the furnace body, subsequently, a silicon nitride film 15 using a CVD method is formed to a thickness of about 100 to 200 nm, and patterning is performed using a photolithography method so that the silicon oxide film 14 and the silicon nitride film 15 may remain only on the air flow rate detection part.

Figure 4:
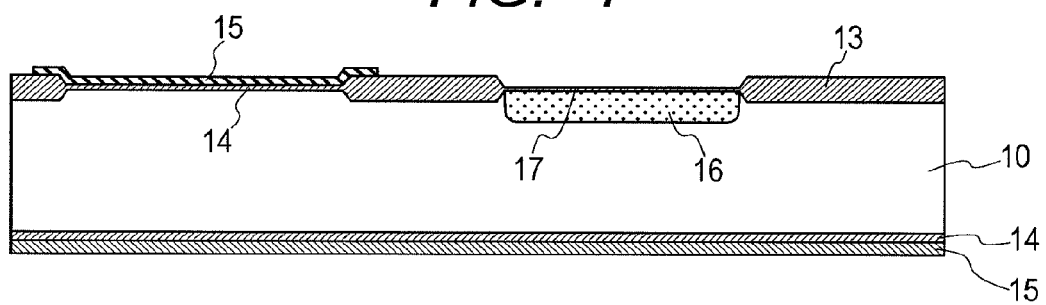
FIG. 4 is a main part sectional view showing the semiconductor substrate manufacturing process of the thermal fluid flow sensor according to the first embodiment of the present invention.

Next, as shown in FIG. 4, phosphorus, boron, or arsenic is implanted into a region of the substrate corresponding to the circuit part on the substrate by implantation after washing to form a diffusion layer 16. Incidentally, in a region where implantation is not required, the silicon oxide film 14 and the silicon nitride film 15 are made to remain at the time of the patterning.

Figure 5:
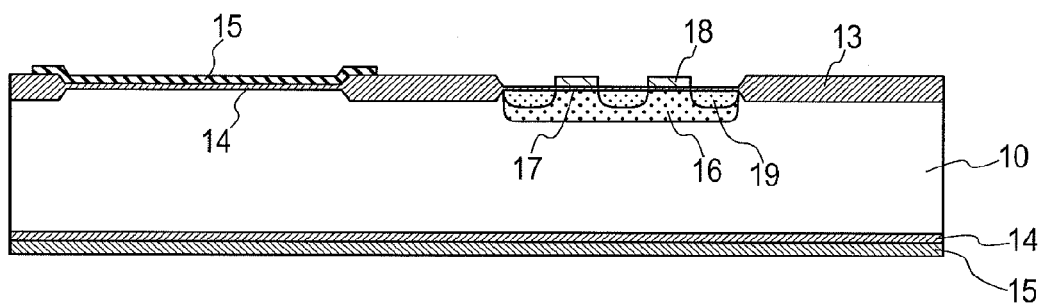
FIG. 5 is a main part sectional view showing the semiconductor substrate manufacturing process of the thermal fluid flow sensor according to the first embodiment of the present invention.

Next, as shown in FIG. 5, after making the diffusion layer 16 clean by washing, a gate oxide film 17 is formed by a thermal oxidation process with the furnace body, then a polysilicon film is formed, and patterning by a photolithography method is performed to form a gate electrode 18. Incidentally, although the film thickness of the gate oxide 17 depends on the circuit characteristic, it is about 5 to 30 nm and the film thickness of the gate electrode is about 100 to 150 nm. After this, ion implantation by an ion implanter is performed to form a diffusion layer 19 that is used as a source and a drain. Moreover, when the characteristic of a MOS transistor is altered according to a circuit characteristic, the kind of ion to be implanted, an ion implantation dose, the thickness of the gate oxide film, and a gate electrode material are changed, a transistor that matches each characteristic is formed by repeating the method of manufacturing the MOS transistor.

Figure 6:
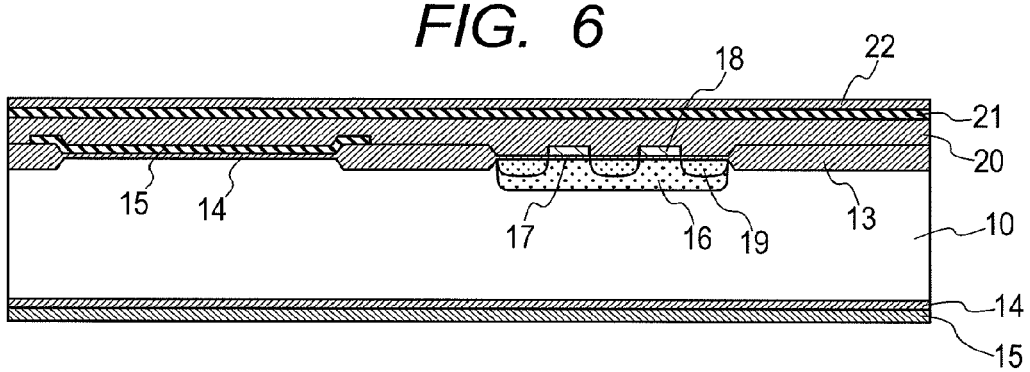
FIG. 6 is a main part sectional view showing the semiconductor substrate manufacturing process of the thermal fluid flow sensor according to the first embodiment of the present invention.

Next, as shown in FIG. 6, an insulating film 20 is formed thick and the insulating film 20 is planarized using a CMP method or etching back method. Incidentally, the insulating film 20 is a silicon oxide film containing boron or phosphorus or a silicon oxide film formed using a plasma CVD method. After the planarization, an insulating film 21 and an insulating film 22 are formed sequentially to form a layered film. Incidentally, the insulating film 21 is a silicon nitride film formed by, for example, using a CVD method and its thickness is about 100 to 200 nm; the insulating film 22 is a silicon oxide film formed by, for example, using a CVD method, and its film thickness is about 100 to 200 nm. Incidentally, the insulating films 14, 19, and 21 are films that have a compressive stress whose residual stress is 50 MPa to 250 MPa; the insulating films 15, 20 are films that have a tensile stress of 700 MPa to 1200 MPa. Incidentally, after each process, especially after formation of the silicon oxide film using a CVD method and the silicon nitride film using a plasma CVD method, it is advisable to perform a heat treatment at 850° C. or more, preferably at 1000° C., on them in a furnace body or in a lamp heating apparatus under a nitrogen atmosphere in order to make the film dense. Moreover, although the insulating film 21 and the insulating film 22 were formed after the CMP in what was described above, the process of forming the insulating film 21 and the insulating film 22 may be deleted by stress adjustment of the whole.

Figure 7:
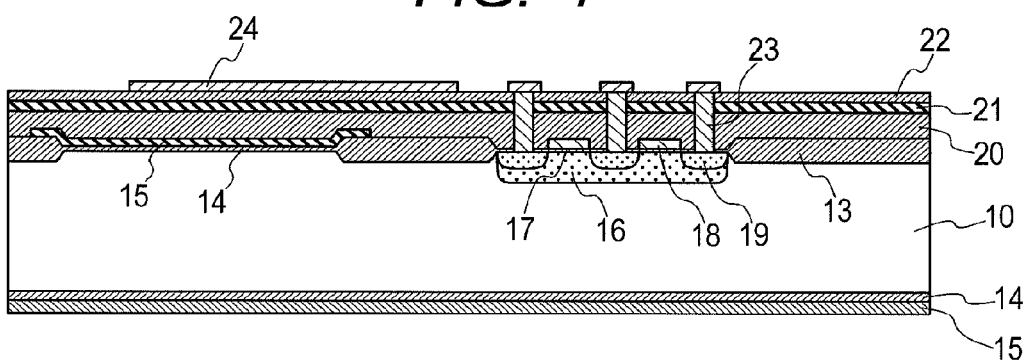
FIG. 7 is a main part sectional view showing the semiconductor substrate manufacturing process, of the thermal fluid flow sensor according to the first embodiment of the present invention.

Next, as shown in FIG. 7, a metal plug 23 is formed as follows: a contact hole for making connection with a source and a drain 19 of the circuit part and a contact hole for making contact with the gate electrode 18, which is not shown in FIG. 7, are formed; a titanium nitride (TiN) film by a sputtering method or CVD method is formed; following this, a tungsten (W) film by a CVD method is embedded into the contact holes; and the W film in a region other than the holes is removed by the etching back method or CMP method. After this, as a heater of the fluid flow rate detection part and as a metal film of the sensor, a Mo (molybdenum) film is formed by a sputtering method to 100 to 250 nm. In doing this, in order to improve adhesiveness and improve crystallinity, the ground layer insulating film 22 is etched by a sputter etching method using Ar (argon) gas by about 5 to 22 nm before the deposition of Mo, and the Mo film is deposited at a substrate temperature of 200° C. to 500° C. Moreover, in order to further improve the crystallinity of the Mo film, it is advisable to perform a heat treatment at 800° C. or more, preferably at 1000° C., on the Mo film in the furnace body or the lamp heating apparatus under a nitrogen atmosphere after the formation of the Mo film. Next, using a photolithography method, a metal film 24 is patterned to form the heater and the sensor of the flow rate detection part. Incidentally, the same metal film 24 as that of the heater and the sensor is placed on the metal plug 23, so that the metal plug 23 is not etched at the time of processing the heater film 24. Incidentally, although a lamination of TiN and W was mentioned as materials of the metal plug 23, it may be made of only W or Poly-Si. Moreover, as means for improving the crystallinity of the metal film 24 of the heater and the sensor, an aluminum nitride film (AlN) may be formed as a ground layer. It is preferable that the film thickness of the aluminum nitride film should be about 20 to 100 nm.

Figure 8:
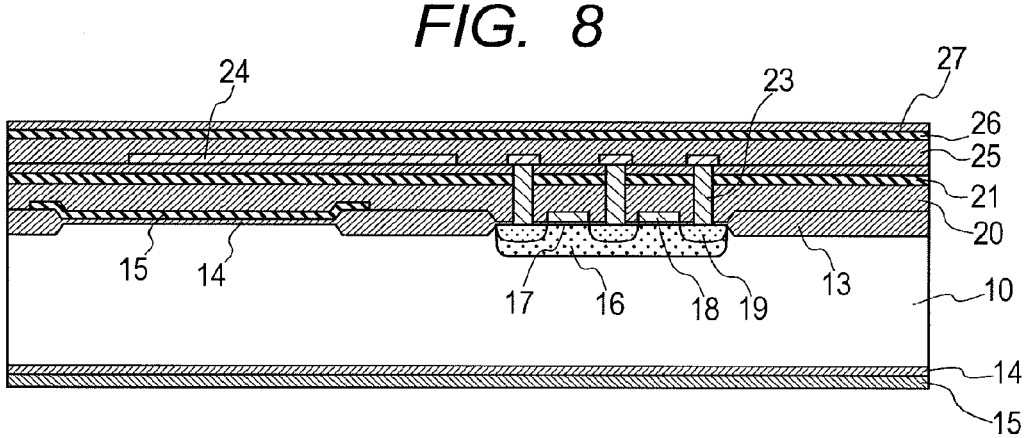
FIG. 8 is a main part sectional view showing the semiconductor substrate manufacturing process of the thermal fluid flow sensor according to the first embodiment of the present invention.

Next, as shown in FIG. 8, an insulating film 25, an insulating film 26, and an insulating film 27 are sequentially formed to form a layered film of multiple insulating films. The insulating film 25 is a silicon oxide film formed by, for example, a CVD method or a low-temperature CVD method that uses TEOS (tetraethoxysilane) as a raw material with plasma, and its film thickness is about 300 to 500 nm. The insulating film 26 is a silicon nitride film formed by, for example, a CVD method or low-temperature CVD method, and its film thickness is about 150 to 200 nm. The insulating film 27 is a silicon oxide film formed by, for example, a CVD method or a low-temperature CVD method that uses TEOS as a raw material with plasma, and its film thickness is about 100 to 500 nm. Incidentally, the insulating films 25, 27 are films that have a compressive stress whose residual stress is 50 MPa to 250 MPa; the insulating film 26 is a film that has a tensile stress of 700 MPa to 1400 MPa. By performing the heat treatment at 850° C. or more, preferably 1000° C., after the film formation by deposition, the insulating film 26 is adjusted so as to have a desired tensile stress. Similarly, by performing the heat treatment at 850° C. or more, preferably 1000° C., after the film formation by deposition, the oxide silicon films of the insulating films 25, 27 are also adjusted so as to have a desired compressive stress. Although the above heat treatment may be performed collectively after the insulating films 25 to 27 are formed, preferably, it is advisable to perform the heat treatment sequentially as follows: film formation and heat treatment of the insulating film 25 is performed; subsequently, the same processing and treatment are performed on the insulating film 26; and after that, the same processing and treatment are performed on the insulating film 27. This is because a moisture resistance of each of the insulating films 25 to 27 will be improved by these heat treatments. Moreover, by performing the heat treatment, each of the insulating films 25 to 27 becomes an insulating film whose residual stress is resistant to variation even when the heater heating is performed at the time of a flow rate measurement. As a result, it is possible to suppress aging variation of the resistance of the insulating film by the heater heating in a longtime.

Figure 9:
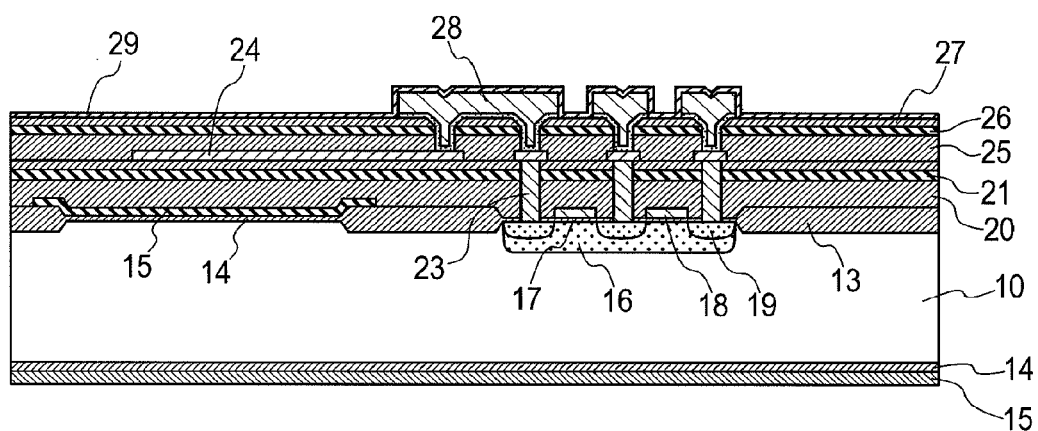
FIG. 9 is a main part sectional view showing the semiconductor substrate manufacturing process of the thermal fluid flow sensor according to the first embodiment of the present invention.

Next, as shown in FIG. 9, a connection hole is formed by a dry etching method, a wet etching method, or the like. Subsequently, a layered film of an Al alloy film of a thickness of, for example, about 400 to 800 nm is formed as a first wiring metal film for connecting the circuit part and the fluid flow rate detection part. Incidentally, in order to make good contact with the metal film 24 exposed in the connection hole, a surface of the Mo film may be sputter etched with Ar (argon) gas before the formation. Furthermore, in order to make the contact positive, layered film structures as follows may be formed: a two-layer film of a barrier metal film, such as a TiN film, and an Al alloy film, the barrier film being formed before deposition of the Al alloy; and a three-layer film realized by further forming a TiN film on the Al film of the two-layer film. In doing this, the thickness of the barrier metal film is desirable to be 200 nm or less. Moreover, although the TiN film is mentioned as the barrier metal film, a TiW (titanium tungsten) film, a Ti (titanium) film, and a layered film of these may be applicable. Next, the first wiring metal film is patterned using a photolithography method, and a first wiring layer 28 is formed by a dry etching method or wet etching method.

Here, as shown in FIG. 9, when forming the metal film 24 as the heating resistor, a metal film 24 that is provided on the same layer as the heating resistor can be further formed between the wiring layer 28 and control circuits (16 to 19). This is because when forming the wiring layer 28, a hole for taking contact with it must be formed by etching to the insulating films 25 to 27, but formation of the metal film 24 on the upper part of the metal plug 23 makes it possible to suppress damage to the metal plug 23 caused by the etching.

Figure 10:
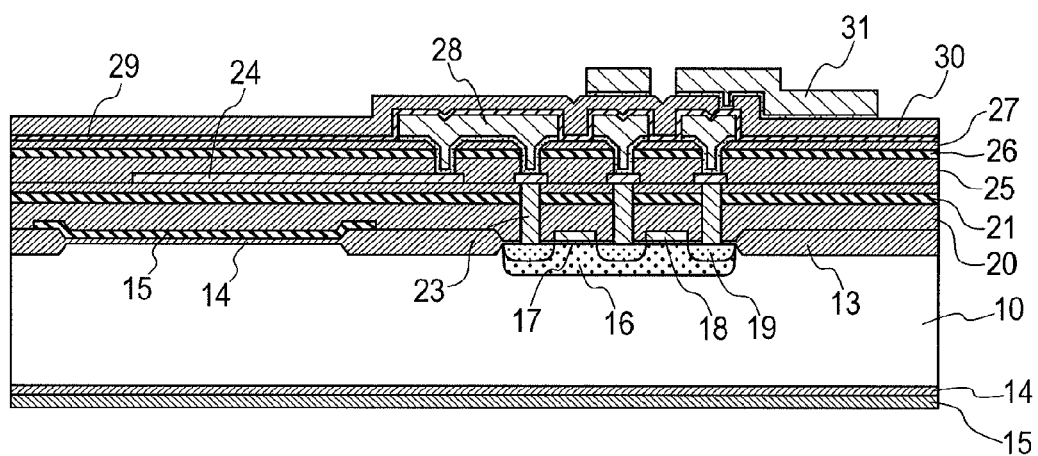
FIG. 10 is a main part sectional view showing the semiconductor substrate manufacturing process of the thermal fluid flow sensor according to the first embodiment of the present invention.

Next, as shown in FIG. 10, an insulating film 29 and an insulating film 30 are formed. Note that the insulating film 29 needs to be a material with a larger selection ratio at the time of etching than inorganic insulating films that will be formed after this. Specifically, a material that has a high selection ratio of more than 30, preferably more than 50, with respect to the inorganic insulating film is, advisable. Specifically, applicable materials are an aluminum nitride (AlN) film, an aluminum oxide (AlO) film, a silicon carbide (SiC) film, etc. Here, it is desirable that the film thickness of the insulating film 29 should be 200 nm or less. This is for reducing an influence of the residual stress by the insulating film 29. Especially preferably, the film thickness is about 20 to 100 nm. This is because ease of removal when removing the insulating film 29 later should be considered. Here, the above-mentioned selection ratio of the insulating film 29 means a selection ratio when etching (for example, in the case of dry etching, etching using a fluorine-containing gas, and in the case of wet etching, an aqueous solution of hydrofluoric acid (ex., a diluted solution of hydrofluoric acid)) for removing the inorganic insulating film is performed. The insulating film 30 is an oxide silicon film formed by, for example, a CVD method or a low-temperature CVD method that uses TEOS as a raw material with plasma, and its film thickness is about 100 to 500 nm. After this, a connection hole of the first wiring, layer or the metal film 24 and a connection hole of the second wiring layer 28 that will be formed later is formed by a dry etching method, a wet etching method, or the like. In doing this, after forming the connection hole in the insulating film 30, for etching at the time of forming the connection hole in the insulating film 29, if in the case of the dry etching, a gaseous species is changed from a fluorine-containing gas to a chlorine-containing gas in order to remove the insulating film 29. On the other hand, if the etching is wet etching, an etchant is changed from a hydrofluoric acid diluted solution to an alkaline system liquid (KOH or TMAH). Subsequently, a layered film of an Al alloy film of a thickness of, for example, about 400 to 1000 nm is formed as a second wiring metal film for connecting the circuit part and the fluid flow rate detection part. Incidentally, in order to make good contact with the first wiring layer 28 that is a ground layer, a surface of the first wiring layer 28 may be sputter etched with Ar (argon) gas before the formation. Furthermore, in order to make the contact positive, the following layered film structures may be formed: a two-layer film of a barrier metal film, such as a TiN film, and an Al alloy film, the barrier film being formed before the deposition of the Al alloy; a three-layer film made by further forming a TiN film on the Al film of the two-layer film; and the like. In doing this, it is desirable that the thickness of the barrier metal film should be 200 nm or less. Moreover, although the TiN film was mentioned as the barrier metal film, a TiW (titanium tungsten) film, a Ti (titanium) film, and a layered film of these may be applicable. Next, the second wiring metal film is patterned using a photolithography method, and a second wiring layer 31 is formed by a dry etching method or wet etching method.

Figure 11:
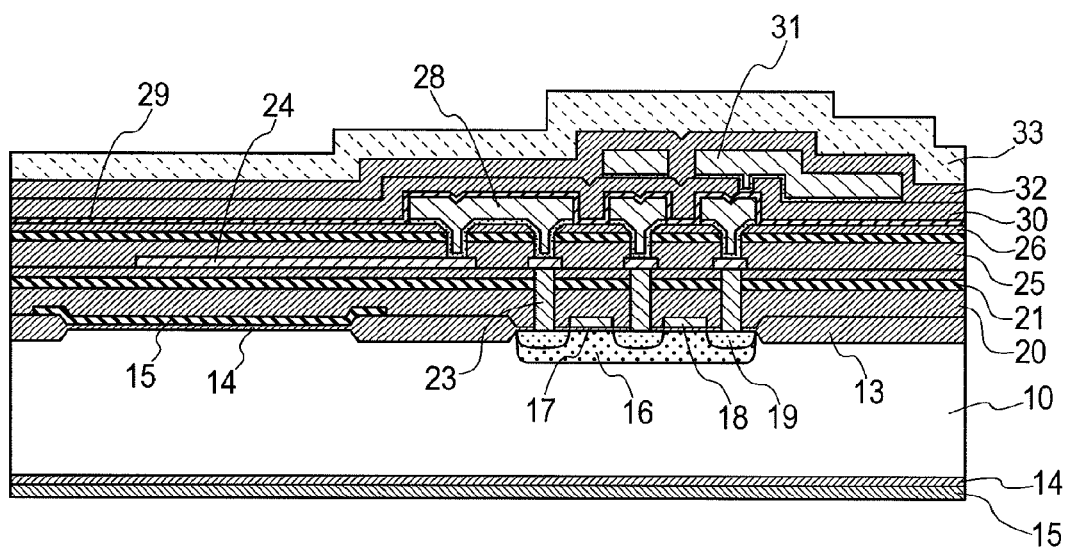
FIG. 11 is a main part sectional view showing the semiconductor substrate manufacturing process of the thermal fluid flow sensor according to the first embodiment of the present invention.

Next, as shown in FIG. 11, an insulating film 32 and an insulating film 33 are formed to form a layered film. The insulating film 32 is a silicon oxide film formed by, for example, a CVD method or a low-temperature CVD method that uses TEOS as a raw material with plasma, and its film thickness is about 300 to 800 nm. The insulating film 33 is a silicon nitride film formed by, for example, a CVD method or a low-temperature CVD that uses plasma. In order to suppress damage to the transistors and the wiring caused by filler at the time of resin mold formation and to prevent corrosion of the wiring caused by moisture penetration from the outside, it is formed thick to have a film thickness of about 800 to 1200 nm.

Figure 12:
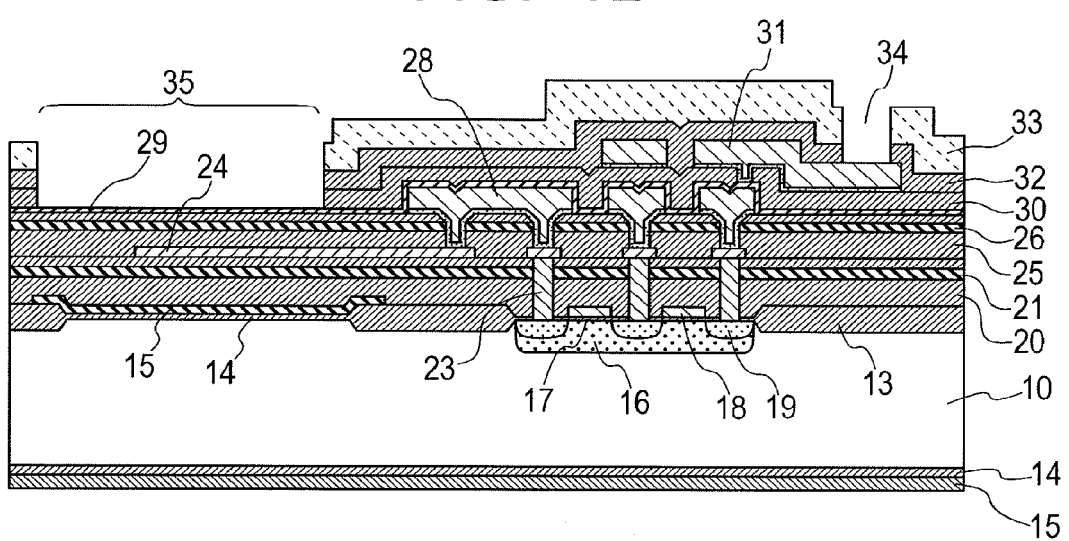
FIG. 12 is a main part sectional view showing the semiconductor substrate manufacturing process of the thermal fluid flow sensor according to the first embodiment of the present invention.

Next, as shown in FIG. 12, patterning is performed using a photolithography method, and an insulating film 32 and an insulating film 33 on an electrode 34 for connection with the outside (indicating portions in the second wiring layer 31 where the upper layer insulating films 32, 33 were removed to form pads; similarly hereafter) are removed by dry etching. At this time, the insulating film 33, the insulating film 32, and the insulating film 30 above the flow rate detection part are removed by dry etching to form an opening 35. Incidentally, since in the portion for detecting the flow rate, the insulating film 29 acts as an etch stop layer of the dry etching, the insulating film that controls the residual stress of underlying layers beneath this layer is not affected by influences of over-etching of the dry etching and an in-plane distribution; therefore, it becomes possible to form the insulating film being controlled within a range of a designed film thickness and within a range of the residual stress.

Figure 13:
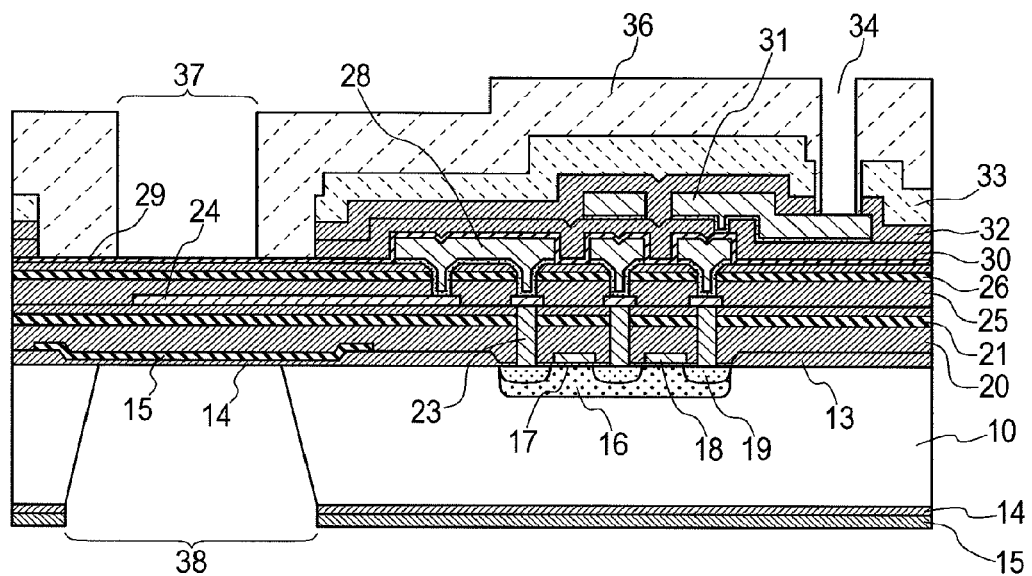
FIG. 13 is a main part sectional view showing the semiconductor substrate manufacturing process of the thermal fluid flow sensor according to the first embodiment of the present invention.

Next, as shown in FIG. 13, a polyimide film, for example, is formed as an organic protective film 36, and is made into a shape such that at least parts of the polyimide film over both the electrode 34 for connection with the outside and an air flow rate detection part 37 are removed using a photolithography method. Next, a resist pattern is formed on the backside of the semiconductor substrate 10 by a photolithography method, the insulating films 14, 15 formed on the backside are removed by a dry etching or wet etching method, and subsequently, the backside of the Si substrate is wet etched with an aqueous solution whose main ingredient is KOH (potassium hydrate), TMAH, or the like using the remaining insulating films 14, 15 as masks to form a diaphragm 38. Incidentally, the diaphragm 38 is designed to be larger than the flow rate detection part 37 of the protective film 36. Preferably, each side of the diaphragm 38 is formed to be larger than each side of the flow rate detection part 37 of the protective film 36 by about 50 μm or more. This is because a portion in the protective film 36 inside the outer circumference of the diaphragm 38 has an effect of protecting the diaphragm from dust mixed with air from the outside. It is desirable that the total film thickness of the inorganic insulating films that constitute this diaphragm 38 should be 1.5 μm to 2.5 μm. This is because if it is thinner than these values, strength of the diaphragm 38 will decrease, and a probability that it will be destroyed by collision of dust contained in air intake of a vehicle.

Incidentally, although the thermal fluid flow sensor whose metal film 24 of the heater and the sensor was made up of Mo was explained, the following metal films will do: a metal made up of any one of elements of α-Ta (alpha tantalum), Ti (titanium), W (tungsten), Co (cobalt), Ni (nickel), Fe (iron), Nb (niobium), Hf (hafnium), Cr (chromium), and Zr (zirconium) as a main element, for example; and a films made up of any one of metal nitride compounds, such as TaN (nitride tantalum), MoN (nitride molybdenum), and WN (tungsten nitride), metal silicide compounds, such as MoSi (molybdenum silicide), CoSi (cobalt silicide) and NiSi (nickel silicide), and polycrystalline silicon with phosphorus or boron doped as an impurity, respectively.

When based on the foregoing, features of the method of manufacturing the thermal sensor according to this embodiment are as follows. That is, it is a method of manufacturing the thermal sensor that is equipped with the detection part (3) having a heating resistor, and the circuit part (4) having the control circuit for controlling the heating resistor, comprising the steps of: (a) forming a first layered film (20 to 22) including multiple insulating films above the semiconductor substrate; (b) forming the heating resistor (24) on the first layered film; (c) forming the control circuits (16 to 19) on the semiconductor substrate; (d) forming a second layered film (25 to 27) including multiple insulating films on the heating resistor and above the control circuit; (e) forming an intermediate layer (29) on the second layered film; (f) forming a third layered film (30, 32, 33) including multiple insulating films on the intermediate layer; and (g) etching a portion in the third layered film located above the detection part using the intermediate layer as an etch stop layer (FIG. 12).

Moreover, when paying attention to a structural, aspect of the thermal sensor, features of the invention according to this embodiment will be as follows (FIG. 13). That is, provided is a thermal sensor that has: the semiconductor substrate; the first layered film that is provided above the semiconductor substrate and includes multiple insulating films; the detection part that is provided on the first layered film and has the heating resistor; the circuit part that is provided on the semiconductor substrate and has the control circuit for controlling the heating resistor; the second layered film that is provided on the heating resistor and above the control circuit, and includes multiple insulating films; the intermediate layer provided on the second layered film; and the third layered film that are provided in a region on the intermediate layer from which a portion above the detection part is excluded, and includes multiple insulating films.

This thermal sensor and the method of manufacturing it give the following effects. That is, in the circuit part, protection of the wiring and improvement of moisture resistance by the layered film 30, 32, and 33 are realized. Simultaneously, in the detection part, since the layered film has been removed, it has a desired residual stress that was designed by the layered film 20 to 22 and the layered film 25 to 27. In addition, since the heat quantity of the heater is not deprived through the layered film 30, 32, and 33, it realizes improvement of accuracy of the heater.

Next, in the above-mentioned step (e), it is characterized in that especially the intermediate layer is specified to be any one of aluminum nitride, aluminum oxide, and silicon carbide.

Moreover, when paying attention to the structure of the thermal sensor, features of this invention will be as follows. That is, provided is a thermal sensor that has: the semiconductor substrate; the first layered film that is provided above the semiconductor substrate and includes multiple insulating films; the detection part that is provided on the first layered film and has the heating resistor; the circuit part that is provided on the semiconductor substrate and has the control circuit for controlling the heating resistor; the second layered film that is provided on the heating resistor and above the control circuit, and includes multiple insulating films; the intermediate layer provided on the second layered film; and the third layered film that is provided on the intermediate layer and above the control circuit, and includes multiple insulating films, wherein the intermediate layer is made up of any one of aluminum nitride, aluminum oxide, and silicon carbide.

This is because these materials have larger selection ratios in the fluorine-containing material dry etching or in wet etching with hydrofluoric acid aqueous solution than materials constituting the insulating films 30, 32, and 33 (for example, silicon oxide and silicon nitride) that make up the layered film does, and functions effectively as the etch stop layer to the layered film.

Moreover, the opening 35 has a relationship of being larger than the diaphragm 38. That is, portions of the layered film 30, 32, and 33 are removed so that it may have a larger area than the diaphragm 38 to form the opening 35. This is to prevent the residual stress of a detection part 3 from varying by making the layered film 30, 32, and 33 remain on the upper part of the diaphragm 38.

Figure 14:
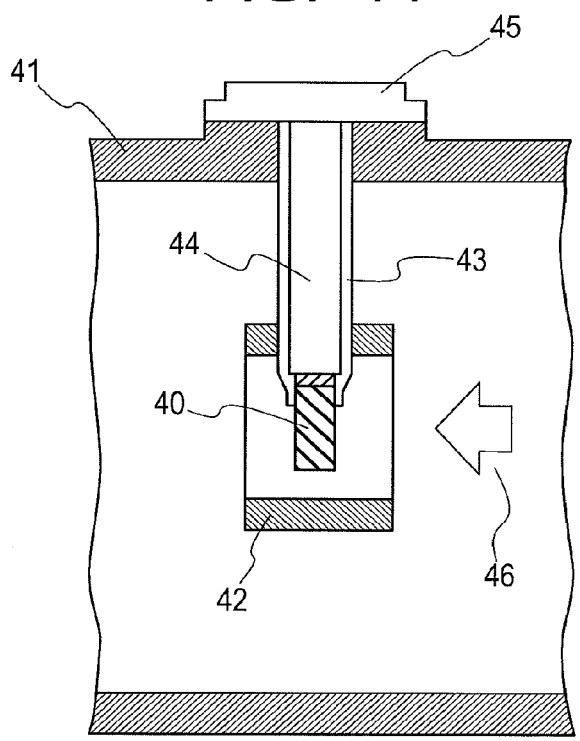
FIG. 14 is an outline layout drawing of a thermal air flow meter on which the thermal fluid flow sensor according to the first embodiment of the present invention attached to an intake passage of an internal combustion engine, such as of a vehicle, is installed.

FIG. 14 is an outline layout drawing of a thermal air flow meter to which the thermal fluid flow sensor attached to an intake passage of an internal combustion engine of a vehicle etc. is installed according to the first embodiment of the present invention. A thermal air flow meter 44 consists of a measurement element 1 that is the thermal fluid flow sensor, a support member 42, and a link part 43 for electrically connecting the outside and the measurement element 1, and the measurement element 1 is placed in a sub passage 41 located in the interior of the air passage 40. Intake air 45 flows in a direction of air flow shown by an arrow of FIG. 14 or in a direction opposite to this depending on a condition of the internal combustion engine.

Second Embodiment

The thermal fluid flow sensor according to a second embodiment is different from that of the first embodiment in that it has a structure such that the insulating film 29 acting as the etch stop layer is removed from the uppermost layer of the flow rate detection part 37 as compared with that of the first embodiment.

Figure 15:
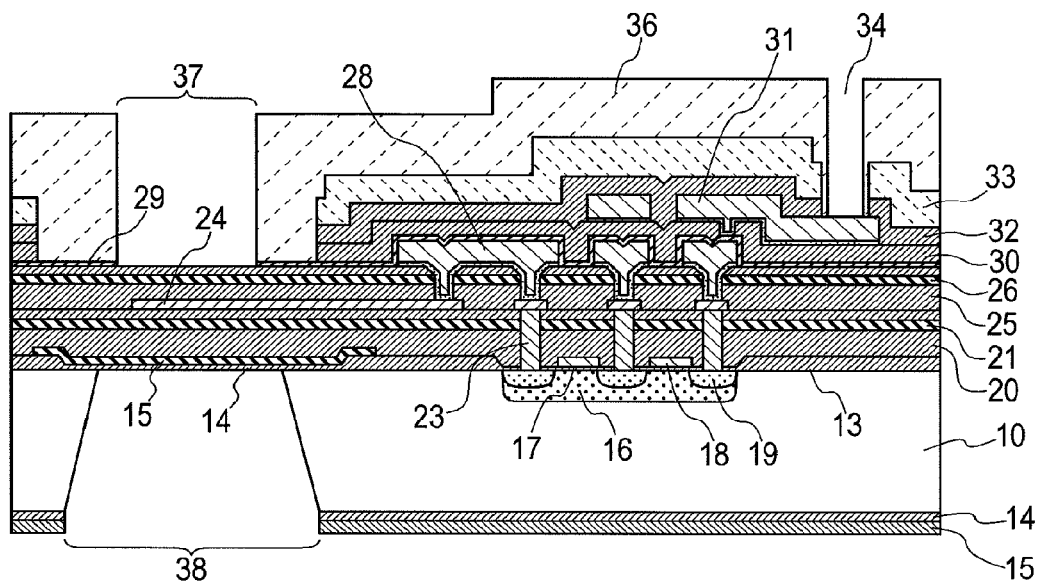
FIG. 15 is a semiconductor substrate main part sectional view showing one example of a thermal fluid flow sensor according to a second embodiment of the present invention.

FIG. 15 is one example of a thermal fluid flow sensor according to the second embodiment, showing a main part sectional view of the semiconductor substrate 2. Since the thermal fluid flow sensor according to the second embodiment has many common components as those of the first embodiment, detailed explanations are omitted for the common components and components that are different will be explained selectively. Incidentally, the same reference numerals are used for the same components as the components shown in the first embodiment, respectively.

Although in the first embodiment, a structure such that the insulating film 29 acting as the etch stop layer is left on the uppermost layer of the flow rate detection part 37 is used; it is characterized in that if the film thickness of the insulating film 29 is thick, which destroys a stress balance of the whole flow rate detection part 37, the insulating film 29 will be removed using the organic protective film 36 as a mask, as shown in the second embodiment. Adoption of this structure makes it possible to control the residual stress of the flow rate detection part 37, producing an effect of improved reliability. Here, a process of removing the insulating film 29 is performed by etching that uses a chlorine-containing gas in the case of dry etching or an alkaline system solution (KOH or TMAH) in the case of wet etching. Moreover, also in the process of forming the connection hole of the first wiring layer or the metal film 24 and the first wiring layer 28, which was described in the first embodiment, the insulating film 29 needs to be removed. The number of steps can be curtailed also by removing the insulating film 29 above the flow rate detection part 37 in that process.

Incidentally, although the organic protective film 36 was used as the mask in the second embodiment, a method of, before forming the organic protective film 36, i.e., after forming the opening 35 by removing the insulating film 33, the insulating film 32, and the insulating film 30 by dry etching, removing the insulating film 29 acting as the etch stop layer consecutively also give the same effect as that of the second embodiment.

Third Embodiment

A third embodiment has a structure that a metal film is adopted as the etch stop layer.

Figure 16:
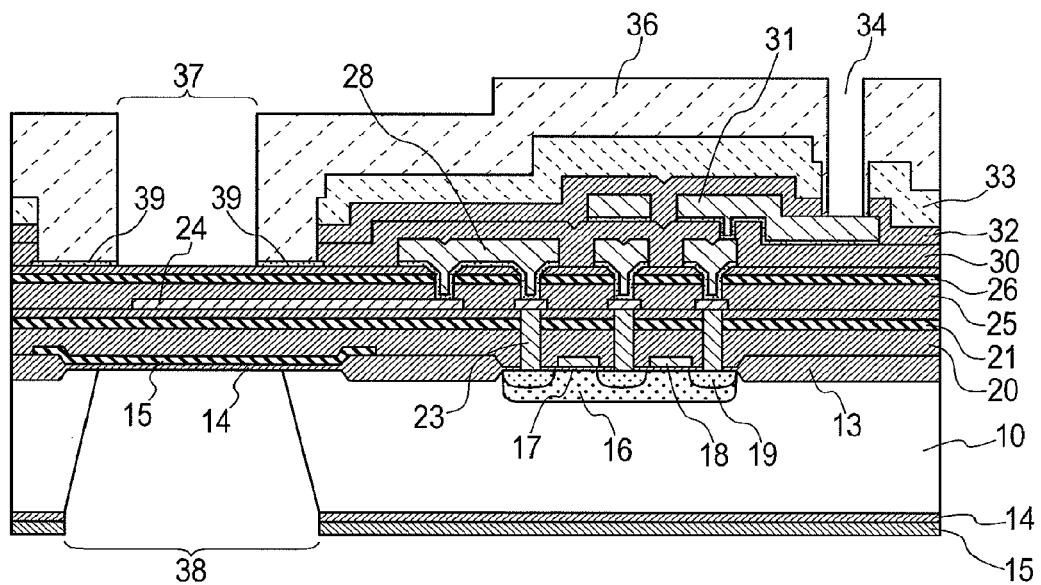
FIG. 16 is a semiconductor substrate main part sectional view showing one example of a thermal fluid flow sensor according to a third embodiment of the present invention.

FIG. 16 shows one example of a thermal fluid flow sensor according to the third embodiment, showing a main part sectional view of the semiconductor substrate 2. Since the thermal fluid flow sensor according to the third embodiment has many common components as those of the first embodiment, detailed explanations are omitted for the common components and components that are different will be explained selectively. Incidentally, the same reference numerals are used for the same components as the components shown in the first embodiment, respectively.

Although the insulating film 29 acting as the etch stop layer was used in the first embodiment, the metal film 39 acting as the etch stop layer is formed instead of the above-mentioned insulating film in the third embodiment. FIG. 16 shows especially a structure such that the metal film 39 acting the etch stop layer is removed from the uppermost layer of the flow rate detection part 37 similarly with the second embodiment. However, a structure such that the metal film being the uppermost layer of the flow rate detection part 37 is left similarly with the first embodiment is also possible.

The metal film 39 acting the stop layer is processed as follows: the Al film is processed using the barrier film used for the first wiring layer 28, such as of titanium nitride (TiN), tungsten nitride (WN), titanium tungsten (TiW), etc.; the Al film is patterned using a photolithography method again so as to cover a wider area than the flow rate detection part 37 and the diaphragm 38; and a portion that serves as the metal film 39 is left in the Al film. Note that in this process, the metal film 39 is not left on respective upper layers of the wiring layer 28, as a point different from the first and second embodiments. This is because if the metal film 39 is allowed to remain at these positions, mutual conduction will be established between them and the first wiring layer 28.

After this, the process proceeds similarly with the first embodiment: the opening 35 is processed by dry-etching the insulating film 33, the insulating film 32, and the insulating film 30; and subsequently the organic protective film 36 is formed and patterned. Thereby the third embodiment attains the same effect as that of the first embodiment. Furthermore, by removing the metal film 39 acting the etch stop layer after that, the same effect as that of the second embodiment can be attained.

Summarizing the foregoing, the method of manufacturing the thermal sensor according to this embodiment is characterized in that the intermediate layer is especially specified to be any one of titanium nitride, tungsten nitride, and titanium tungsten in step (e) according to the first embodiment described above.

Moreover, when paying attention to the structural aspect of the thermal sensor, features of this invention will be as follows. That is, provided is a thermal sensor that has: the semiconductor substrate; the first layered film that is provided above the semiconductor substrate and includes multiple insulating films; the detection part that is provided on the first layered film and has the heating resistor; the circuit part that is provided on the semiconductor substrate and has the control circuit for controlling the heating resistor; the second layered film that is provided on the heating resistor and above the control circuit, and includes multiple insulating films; the intermediate layer provided on the second layered film; and the third layered film that is provided on the intermediate layer and above the control circuit, and includes multiple insulating films, wherein the intermediate layer is made up of any one of titanium nitride, tungsten nitride, and titanium tungsten.

This is because these materials function as the etch stop layer to the layered film 30, 32 effectively similarly with the above-mentioned insulating films such as of aluminum nitride.

Incidentally, although the organic protective film 36 was used as the mask in what was described above, the same effect as that of the second embodiment can be attained also by, before the organic protective film 36 is formed, namely, after the opening 35 is processed by dry etching the insulating film 33, the insulating film 32, and the insulating film 30, removing the metal film 39 acting as the etch stop layer sequentially, Fourth Embodiment This fourth embodiment has a configuration in which the metal film 24 that is on the same layer as the metal film forming the heater and the sensor is used as wiring of the circuit part.

Figure 17:
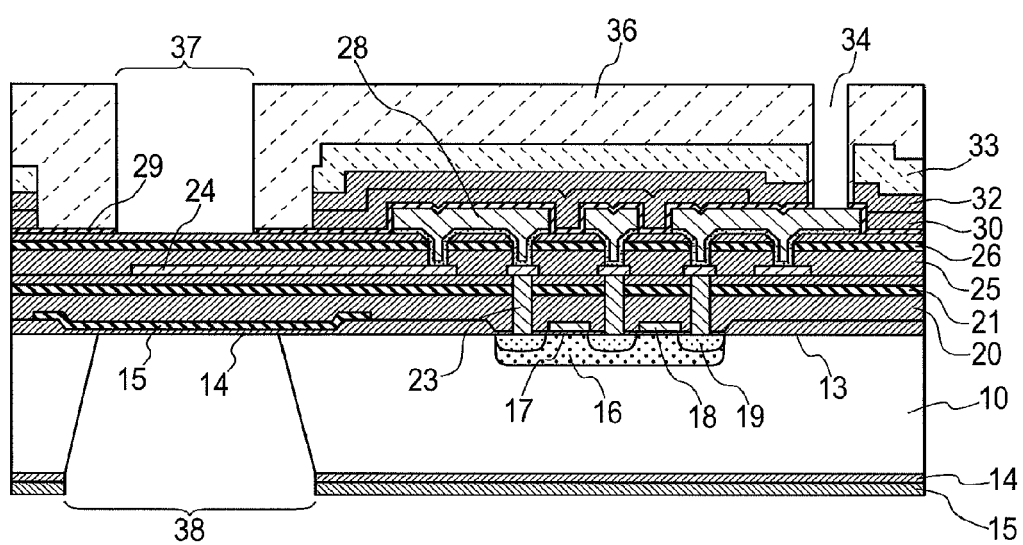
FIG. 17 is a semiconductor substrate main part sectional view showing one example of a thermal fluid flow sensor according to a fourth embodiment of the present invention.

FIG. 17 shows one example of a thermal fluid flow sensor according to a fourth embodiment, showing a main part sectional view of the semiconductor substrate 2. Since the thermal fluid flow sensor according to the fourth embodiment has many common components as those of the first embodiment, detailed explanations are omitted for the common components and components that are different will be explained selectively. Incidentally, the same reference numerals are used for the same components as the components shown in the first embodiment, respectively.

In the first embodiment, the first wiring layer 28 is used for connection of the flow rate detection part 3 and the circuit part 4 and connection inside the circuit part, and the second wiring layer 31 is used for connection of wiring inside the circuit and the outside. This fourth embodiment has a configuration in which the metal film 24 used for the heater and the sensor is used as a wiring layer for realizing wiring inside the circuit to omit the second wiring layer 31 shown in FIG. 13, and the electrode 34 for connection with the outside is given as the first wiring layer 28. That electrode 34 is formed simultaneously with the above-mentioned opening 35 (step (g)).

That is, the method of manufacturing the thermal sensor according to this embodiment is characterized by further comprising a step of forming a wiring layer (28) for connecting the heating resistor and the control circuit before step (f) of the first embodiment described above, and further etching a portion in the third layered film located above the wiring layer in step (g).

Moreover, when paying attention to the structural aspect of the thermal sensor, features of this invention will be as follows. That is, provided is a thermal sensor that further has a wiring layer for connecting the heating resistor and the control circuit, and is characterized in that an electrode for connecting the control circuit and the outside of the thermal sensor is formed on the wiring layer.

By taking this configuration, it becomes possible to attain the same effect as that of the first embodiment and to form the electrode 34 simultaneously with the formation of the opening 35; therefore, manufacturing steps can be curtailed and cost reduction can be attained.

Fifth Embodiment

Figure 18:
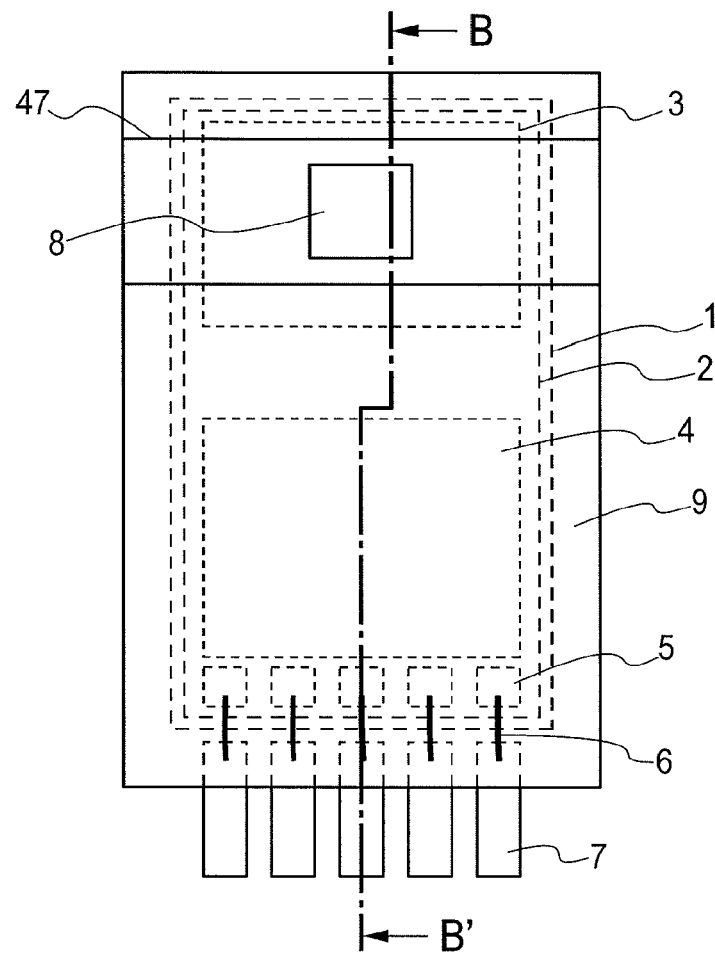
FIG. 18 is a main part plan view showing one example of a thermal fluid flow sensor according to a fifth embodiment of the present invention.
Figure 19:
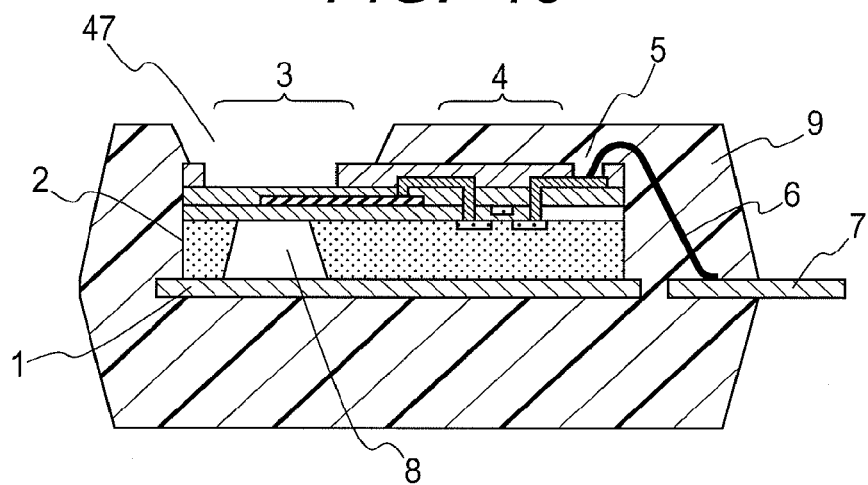
FIG. 19 is a main part sectional view of the thermal fluid flow sensor according to the fifth embodiment of the present invention.

FIG. 18 is one example of a thermal fluid flow sensor according to this fifth embodiment, and FIG. 19 is a main part sectional view taken along line B-B of FIG. 18. Since the thermal fluid flow sensor according to the fifth embodiment has many components in common with those according to the first embodiment, detailed explanations of the common components are omitted and different components will be explained selectively. Incidentally, the same reference numerals are used for the same components as the components shown in the first embodiment, respectively.

Although in this fifth embodiment, the semiconductor substrate 2 mounted on the lead frame 1 and connection between the electrodes 5 for input/output to/from the outside and the external terminals 7 of the lead frame by wire bonding 6 are the same as those of the first embodiment, but it has a notable feature in how the resin mold 9 covers the substrate 2. This embodiment has a structure such that at least the entire lead frame 1 is covered with the resin mold 9, a region including at least the diaphragm 8 of the flow rate detection part 3 of the semiconductor substrate 2 is exposed, and a groove 47 is formed along a direction in which air flows. By placing a lid (not illustrated) made of another material on this groove 47, a flow passage of air can be formed simply and with excellent accuracy. Moreover, since this embodiment enables adjustment of the air flow rate that is important in measuring the air flow rate to be performed simply by changing the thickness of the resin mold 9 or by changing a shape of the groove 47, a shape of the lid, etc., it is possible to simplify an assembly process and thereby to attain cost reduction.

Incidentally, at least, the organic protective film 36, the insulating film 33, and the insulating film 32 are formed in the underlying layer in a structure of the semiconductor substrate 2 to which the resin mold contacts, and these films protect the structure from a shock by filler at the time of resin mold formation.

Moreover, although the example in which the flow rate detection part and the circuit part are formed on the same substrate was mentioned in this embodiment, the present invention is also applicable to a complex sensor in which other sensors, for example, a humidity sensor, a pressure sensor, etc. are formed.

What is claimed is:

1. A method of manufacturing a thermal sensor that has a detection part having a heating resistor and a circuit part having a control circuit for controlling the heating resistor, the method comprising:
   (a) forming a first layered film including a plurality of insulating films above a semiconductor substrate;
   (b) forming the heating resistor on the first layered film;
   (c) forming the control circuit on the semiconductor substrate;
   (d) forming a second layered film including a plurality of insulating films on the heating resistor and above the control circuit;
   (e) forming an intermediate layer on the second layered film;
   (f) forming a third layered film including a plurality of insulating films on the intermediate layer; and
   (g) etching a portion in the third layered film located above the detection part using the intermediate layer as an etch stop layer.

2. The method of manufacturing the thermal sensor according to claim 1,
   wherein the intermediate layer is formed with any one of aluminum nitride, aluminum oxide, silicon carbide, titanium nitride, tungsten nitride, and titanium tungsten in step (e).

3. The method of manufacturing the thermal sensor according to claim 1, further comprising:
   etching a portion in the intermediate layer located above the detection part after the step (g).

4. The method of manufacturing the thermal sensor according to claim 1, further comprising:
   forming a wiring layer for connecting the heating resistor and the control circuit before the step (f),
   wherein a metal layer for connecting the wiring layer and the control circuit is further formed in the step (b).

5. The method of manufacturing the thermal sensor according to claim 1, further comprising:
   forming a wiring layer for connecting the heating resistor and the control circuit before the step (f),
   wherein in the step (g), a portion in the third layered film located above the wiring layer is further etched.

* * * * *